(12) United States Patent
Bonneville et al.

(10) Patent No.: US 6,311,769 B1
(45) Date of Patent: Nov. 6, 2001

(54) THERMAL INTERFACE MATERIALS USING THERMALLY CONDUCTIVE FIBER AND POLYMER MATRIX MATERIALS

(75) Inventors: W. Scott Bonneville, Cupertino; John E. Cooney, Mountain View; Scott O. Peck, Palo Alto, all of CA (US)

(73) Assignee: Space Systems/Loral, Inc., Palo Alto, CA (US)

( * ) Notice: Subject to any disclaimer, the term of this patent is extended or adjusted under 35 U.S.C. 154(b) by 0 days.

(21) Appl. No.: 09/435,664

(22) Filed: Nov. 8, 1999

(51) Int. Cl.$^7$ .................................................. H05K 7/20
(52) U.S. Cl. ............................................. 165/185; 361/704
(58) Field of Search .................................. 165/185, 905; 361/704; 257/720

(56) References Cited

U.S. PATENT DOCUMENTS

| | | | |
|---|---|---|---|
| 3,864,309 | * | 2/1975 | Bilow et al. ..................... 260/47 UA |
| 4,916,038 | * | 4/1990 | Lau et al. ............................. 428/447 |
| 5,135,783 | * | 8/1992 | Harvey et al. ........................... 428/1 |
| 5,255,738 | * | 10/1993 | Przilas ................................. 165/185 |
| 5,316,080 | * | 5/1994 | Banks et al. .......................... 165/185 |
| 5,390,734 | * | 2/1995 | Voorhes et al. ....................... 165/185 |
| 5,852,548 | * | 12/1998 | Koon et al. ........................... 361/704 |
| 5,858,537 | * | 6/1999 | Brown et al. ......................... 428/408 |
| 5,893,955 | * | 4/1999 | Rousseau et al. ................. 156/89.22 |

* cited by examiner

Primary Examiner—Allen Flanigan
(74) Attorney, Agent, or Firm—Kenneth W. Float

(57) ABSTRACT

Thermal interface materials for use in space applications. The thermal interface materials comprise a plurality of graphitized thermally conductive (carbon based) fibers 6 that are contained, immersed, or embedded, in one or more substantially non-outgassing polymer matrix materials. Both relatively stiff and relatively stiff and compliant polymer matrix materials may be used to secure the thermally conductive fibers. The thermally conductive fibers and non-outgassing polymer matrix material may be additionally cured to improve their conductive properties. The polymer matrix materials contain volatile condensable material of less than 0.1 percent and exhibit a total mass loss of less than 1.0 percent per an ASTM E595 procedure.

10 Claims, 1 Drawing Sheet

THERMAL INTERFACE MATERIALS USING THERMALLY CONDUCTIVE FIBER AND POLYMER MATRIX MATERIALS

BACKGROUND

The present invention relates generally to heat conducting materials, and more particularly, to a thermal interface material that uses thermally conductive fiber disposed in a low- or non-outgassing polymer matrix material adapted for use in spacecraft applications.

There are several generally used classes of thermal interface materials. These include loaded organic materials, thermal gasket type materials, and thermal grease. Several thermal interface materials are discussed in the "Satellite Thermal Control handbook", for example, by David G. Gilmore, at pages 4-52 to 4-58.

Conventional loaded organic thermal interface materials use a highly loaded (organic) carrier with many conductive particles. With such conventional interface materials, the bond line thickness is minimized in order to maximize thermal performance. Unfortunately, in loaded silicone interface materials, for example, a thermal bottleneck exists because of the conductance through the matrix and at (many) particle-to-particle contact points. These conventional interface materials work relatively well when thin bond lines and flat surfaces are present.

To provide the desired thermal performance, the thermal gasket type interface materials must be subjected to high pressure, which impacts structural loads and can cause bowing of mounting panels, for example. Separation (zero pressure) may occur at some distance from bolts that secure the gasket. Consequently, use of such gaskets is generally limited to small scale applications, where bolt-to-bolt spacing is a relatively small distance.

The thermal grease interface materials provide relatively good thermal performance. However, the thermal grease interface materials have been found to be major sources of contamination, and are not generally used in spacecraft applications.

Prior art conducting materials also include Gelvet™, a material manufactured by Johnson Matthey, Inc. and AF Inter Connector material manufactured by Shin Etsu, for example. Both of these products use carbon fibers in a silicone matrix with the carbon fibers disposed normal to the interface surface. the AF material acts as an electrical conductor between two devices, while the Gelvet material is designed to conduct heat between heat sinks and heat generating devices. Both of these solutions are designed for electrical non-space applications and do not use a low- or non-outgassing polymer matrix material. It has also been found that the Gelvet material may also exhibit fiber damage during cutting of the graphitized carbon fiber and may have a less consistent distribution of fiber length.

Accordingly, it is an objective of the present invention to provide for an improved thermal interface material that uses carbon based fiber in a low- or non-outgassing polymer matrix for use in spacecraft applications.

SUMMARY OF THE INVENTION

To accomplish the above and other objectives, the present invention provides for an improved thermal interface material for use in spacecraft heat dissipation applications. The thermal interface material comprises highly thermally conductive (carbon based) fibers contained, embedded, or immersed, in a low- or substantially non-outgassing polymer matrix material or gel encapsulant.

The low- or non-outgassing polymer matrix material comprises high thermal conductivity, small diameter fibers, such as carbon fibers for example, that are disposed substantially normal to interface surfaces, and protrude above at least one of the surfaces of the low- or non-outgassing polymer matrix material. The thermally conductive fibers adjust to and contact surfaces to which they are attached and conform to macroscopic non-planarity of the surfaces. The thermally conductive fibers act as continuous conductors of heat from surfaces to which they are attached.

For some applications, the thermally conductive fibers may be cut in a manner that reduces damage. This is achieved by cutting green state ungraphitized fibers to length, instead of cutting graphitized thermally conductive fibers. Heat treatment of the carbon based fibers may be done after the green state thermally conductive fibers are cut to length.

The thermally conductive fibers, such as carbon fibers, for example, in the green state (ungraphitized) are cut to a desired length and are then graphitized. The graphitized thermally conductive fibers are then embedded in one or more layers of low- or non-outgassing polymer matrix material having a desired thickness. The graphitized thermally conductive fibers protrude from an interface surface of the low- or non-outgassing polymer matrix material by a predetermined amount. The graphitized thermally conductive fibers and the polymer matrix material securing them are then cured for a prescribed time, period and temperature depending on the selected polymer matrix material and the desired end use properties.

The polymer matrix material used in the thermal interface material is chosen to pass stringent spacecraft environmental requirements. For example, the polymer matrix material is substantially non-outgassing which means that it contains volatile condensable material (VCM) of less than 0.1 percent and has a total mass loss (TML) of less than 1.0 percent per an ASTM E595 procedure. The prior art thermal interface materials discussed in the Background section do not meet these criteria. Methods for introducing the graphitized thermally conductive fibers into the polymer matrix material include flocking, mixing, infiltration, electrostatic, preimpregnation, wicking, or vacuum transfer, for example.

By using green state thermally conductive fibers, cost is reduced since the green state fibers are significantly less expensive to purchase and are easier to cut to length with less damage. The graphitized thermally conductive fibers may be heat treated to enhance the properties that provide high thermal conductivity.

The thermal interface material improves heat transfer between components and/or devices that generate heat and an external environment, such as is provided by a radiator panel, or other heat radiating device, for example, employed on a spacecraft. Also, the polymer matrix material used in the thermal interface material exhibits low outgassing, thus enabling the thermal interface material to be used in a space environment.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
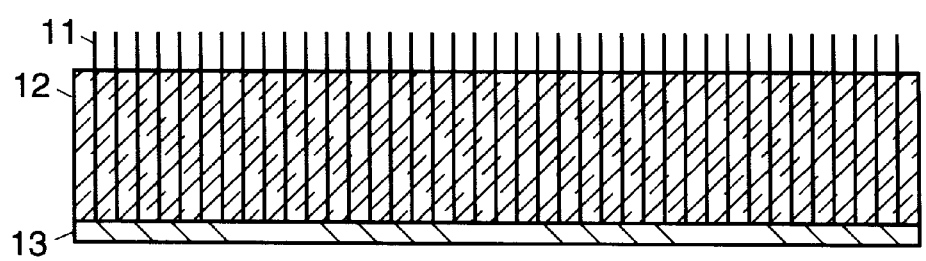
FIGS. 1 and 2 illustrate cross sectional views of two exemplary thermal interface materials in accordance with the principles of the present invention.
Figure 2:
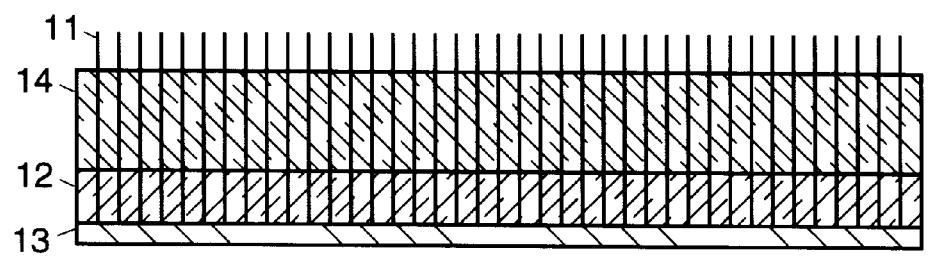

Referring to the drawing figures, FIGS. 1 and 2 illustrate two exemplary embodiments of thermal interface materials 10 in accordance with the principles of the present invention. The thermal interface materials 10 comprise a plurality of graphitized thermally conductive (carbon based) fibers 11 that are contained, immersed, or embedded, in a low- or non-outgassing polymer matrix material 12. The thermally conductive (carbon based) fibers 11 and low- or non-outgassing polymer matrix material 12 are typically cured. The polymer matrix material 12 is substantially non-outgassing and contains volatile condensable material of less than 0.1 percent and has a total mass loss of less than 1.0 percent per an ASTM E595 procedure.

As is shown in FIG. 1, the thermal interface material 10 has a plurality of fibers 11 that are surrounded by the polymer matrix material 12, which may comprise a rigid low- or non-outgassing polymer matrix material 12 or gel material 12. The thermal interface material 10 may optionally have an adhesive layer 13, which may be pressure sensitive, disposed on one surface thereof. The adhesive layer 13 may be used to facilitate installation of the thermal interface material 10 in gasket form. The fibers 11 protrude out of the polymer matrix material 12 adjacent one surface of the thermal interface material 10. The protruding fibers 11 interface to components or surfaces from which heat is to be removed or transferred, such as surfaces of electronic components, or radiator panels employed on a spacecraft, for example.

As is shown in FIG. 2, in a second exemplary embodiment of the thermal interface material 10, the polymer matrix material 12 comprises a rigid low- or non-outgassing polymer matrix material 12 (or gel material 12) disposed adjacent one surface of the thermal interface material 10. A compliant or soft, low- or non-outgassing polymer matrix material 14 (or gel material 14) is then disposed adjacent to the rigid low- or non-outgassing polymer matrix material 12. The compliant or soft low- or non-outgassing polymer matrix material 14 allows the thermal interface material 10 to have added flexibility.

In practice, and by way of example, a preferable way to make the non-outgassing thermal interface material 10 is as follows. Carbon fibers 11 in a green state (ungraphitized) are cut to a desired length using suitable means. The green state ungraphitized carbon fibers 11 are then graphitized, which means that the green state carbon fibers 11 are heat treated to produce highly thermally conductive carbon fibers 11. The graphitized thermally conductive carbon fibers 11 are then embedded in one or more layers of non-outgassing polymer matrix material 12. The layers of non-outgassing polymer matrix material 12 have a thickness that allows ends of the thermally conductive fibers 11 to protrude from an interface surface thereof. The graphitized thermally conductive fibers 11 may be introduced into the non-outgassing polymer matrix material by flocking, mixing, infiltration, electrostatic, preimpregnation, wicking, or vacuum transfer.

The graphitized thermally conductive fibers 11 and the non-outgassing polymer matrix material 12 covering them are then cured for a prescribed time period and temperature depending on the selected polymer matrix material and the desired end use properties. For example, a typical time period is about 30 minutes at a temperature of 150 degrees Celsius may be used to cure thermal interface material 10 containing carbon fibers 11 and silicone gel as a polymer matrix material 12. Preferably, CV-8251 or CV4-2500 type silicone manufactured by Nusil, or DC93500 material manufactured by Dow Corning may be employed.

Heat treatment of the green state fibers 11 is preferably done after they are cut to length. The non-outgassing polymer matrix material 12 used in the thermal interface material 10 contains volatile condensable material (VCM) of less than 0.1 percent and a total mass loss (TML) of less than 1.0 percent. The prior art thermal interface materials discussed in the Background section do not meet these criteria.

By using green state carbon fibers 11, cost is reduced since the green state fibers 11 are significantly less expensive to purchase and are easier to cut to length with less damage. The graphitized carbon fibers 11 may be heat treated to enhance the properties that provide high thermal conductivity. The polymer matrix material 12 is chosen to pass stringent spacecraft environmental requirements, one of which is outgassing. This is achieve because the volatile condensable material in the polymer matrix material 12 is less than 0.1 percent and the total mass loss of the polymer matrix material 12 is less than 1.0 percent per the ASTM E595 procedure.

The thermal interface material 10 improves heat transfer between components and/or devices that generate heat on a spacecraft and an external environment (space), such as is provided by a radiator panel on a spacecraft, for example. Additionally, the non-outgassing polymer matrix material 12 used in the thermal interface material 10 enables the thermal interface material 10 to be used in a space environment.

Thus, an improved thermal interface material that uses carbon based fiber in a polymer matrix material and that may be used in spacecraft applications along with a fabrication method for producing the thermal interface material have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A thermal interface material comprising:
   a plurality of thermally conductive fibers that are immersed in a relatively stiff substantially non-outgassing polymer matrix material and a compliant substantially non-outgassing polymer matrix material disposed adjacent to the relatively stiff polymer matrix material, which fibers protrude from a surface of the thermal interface material.

2. The thermal interface material recited in claim 1 wherein the thermally conductive fibers comprise graphitized carbon.

3. The thermal interface material 10 recited in claim 1 wherein the relatively stiff and compliant non-outgassing polymer matrix materials is cured.

4. The thermal interface material recited in claim 1 further comprising an adhesive layer disposed on a surface of the thermal interface material distal from the protruding thermally conductive fibers.

5. The thermal interface material recited in claim 4 wherein the adhesive layer is pressure sensitive.

6. A thermal interface material comprising:
   a plurality of thermally conductive fibers that are immersed in non-outgassing polymer matrix material, which fibers protrude from the polymer matrix material; and compliant substantially non-outgassing polymer matrix material disposed adjacent to the substantially non-outgassing polymer matrix material.

7. The thermal interface material recited in claim 6 wherein the thermally conductive fibers comprise graphitized carbon.

8. The thermal interface material recited in claim 6 wherein the non-outgassing polymer matrix material is cured.

9. The thermal interface material recited in claim 6 further comprising an adhesive layer disposed on a surface of the thermal interface material distal from the protruding thermally conductive fibers.

10. The thermal interface material recited in claim 9 wherein the adhesive layer is pressure sensitive.

\* \* \* \* \*